(12) United States Patent
Clara et al.

(10) Patent No.: US 6,831,581 B1
(45) Date of Patent: Dec. 14, 2004

(54) DIGITAL-TO-ANALOG CONVERTER ARRANGEMENT WITH AN ARRAY OF UNARY DIGITAL-TO-ANALOG CONVERTING ELEMENTS USABLE FOR DIFFERENT SIGNAL TYPES

(75) Inventors: Martin Clara, Villach (AT); Jörg Hauptmann, Wemberg (AT)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/445,255

(22) Filed: May 23, 2003

(51) Int. Cl.$^7$ .............................................. H03M 1/66
(52) U.S. Cl. ........................................ 341/144; 341/145
(58) Field of Search .................................. 341/144, 145

(56) References Cited

U.S. PATENT DOCUMENTS 5,574,455 A * 11/1996 Hori et al. .................. 341/144

* cited by examiner

*Primary Examiner*—Michael Tokar
*Assistant Examiner*—Lam T. Mai
(74) *Attorney, Agent, or Firm*—Peter F. Corless; Steven M. Jensen; Edwards & Angell, LLP

(57) ABSTRACT

A digital-to-analog converter arrangement able to process input signals with different signal bandwidth is provided. The arrangement comprises a first input terminal for receiving a first digital input signal, a second input terminal for receiving a second digital input signal and switching means being coupled to the first and second input terminals and being adapted to select between the first and second digital input signals so as to output an intermediate digital signal corresponding to the selected one of the first and second digital input signals. The intermediate digital signal is received by an array of unary digital-to-analog converting elements, each unary digital-to-analog converting element being adapted so that, as an analog output signal, a sum signal of output signals of the unary digital-to-analog converting elements is output.

23 Claims, 2 Drawing Sheets

PRIOR ART FIG 2
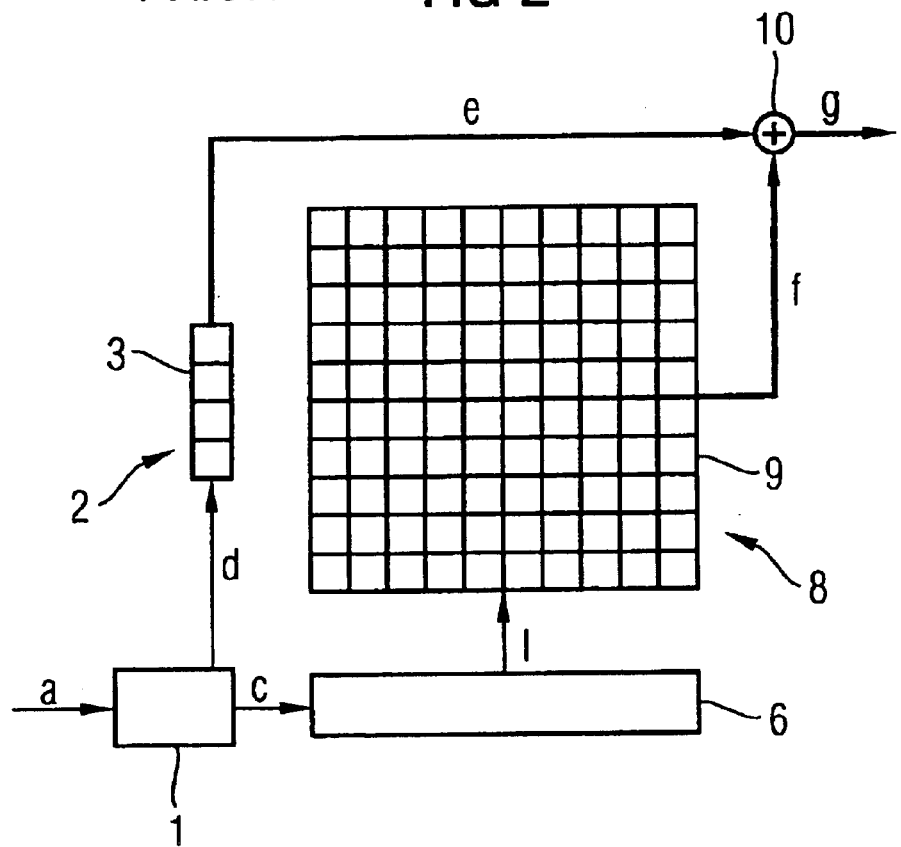
PRIOR ART FIG 3
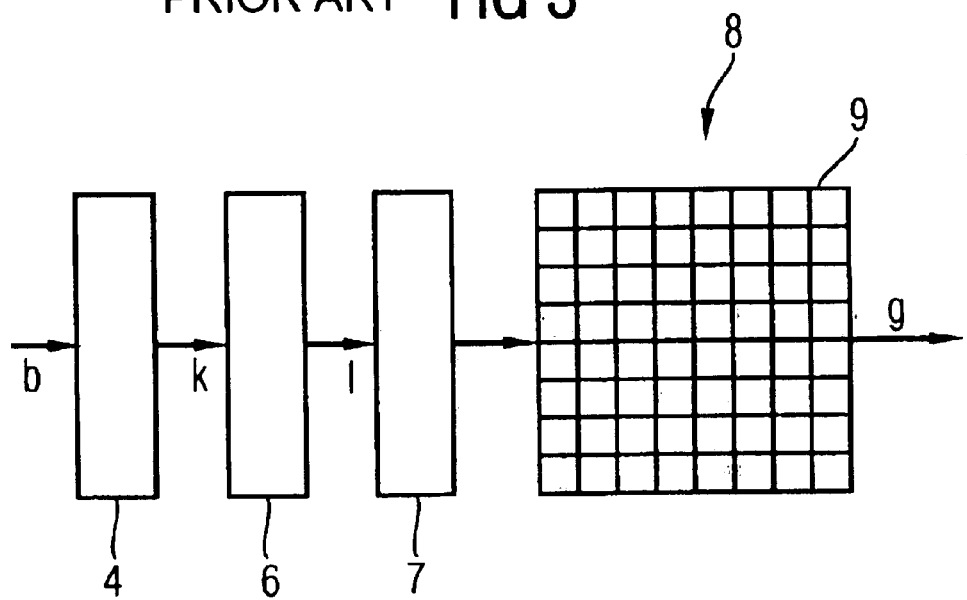

DIGITAL-TO-ANALOG CONVERTER ARRANGEMENT WITH AN ARRAY OF UNARY DIGITAL-TO-ANALOG CONVERTING ELEMENTS USABLE FOR DIFFERENT SIGNAL TYPES

BACKGROUND OF THE INVENTION

The present invention relates to a digital-to-analog converter arrangement. More particularly, the invention relates to a digital-to-analog converter arrangement for processing at least two different formats of digital data, which is usable for example in a multi-standard DSL (Digital Subscriber Line) analog front end.

In a multi-standard DSL analog front end, different data formats have to be processed, for example ADSL (Asymmetric Digital Subscriber Line) and VDSL (Very High Bit Rate Digital Subscriber Line), with the requirements for these two examplatory data formats given roughly in the table below:

|  | ADSL | VDSL |
|---|---|---|
| modulation | DMT (discrete modulation technique) | QAM (quadrature amplitude modulation) |
| signal frequency range | 38 kHz–1.1 MHz | 1 MHz–12 MHz |
| effective resolution | 13.5 bit | 11–12 bit |
| total harmonic distortion (THD) | >80 dB | 65–70 dB |

As can be seen from the above table, the signal frequency range and the performance requirements for the two standards are quite different. Thus, for processing these signals, there is generally no common circuit solution that is optimal in terms of both power consumption and chip area consumption and which is able to process both types of signals. This is especially true for data converters used in the analog front end.

In a transmit path of such an analog front end, a digital-to-analog converter (DAC) is used to convert a digital signal coming from a digital signal processor (DSP) into an analog signal, which is subsequently filtered and amplified before it is applied to a transmission line.

In the following, digital-to-analog converter arrangement according to the state of the art for the above-described two different DSL standards are explained.

FIG. 2 shows an example of a segmented current steering DAC, as described for example by Chi-Hung Lin and Klaas Bult, "A 10-b, 500-MSample/s CMOS DAC in 0.6 mm$^2$", IEEE J. Solid State Circuits, Vol. 33, pp. 1948–1958, the content of which is incorporated by reference herein. In the DAC shown in FIG. 2, a digital input signal a having, for example, a bit-width 12 bits 0 ... 11 is fed to segmenting means 1. Segmenting means 1 forward the lower bits, for example bits 0 to 3, as a signal d to a digital-to-analog converter 2 consisting of binary current cells 3. In the example, digital-to-analog converter 2 comprises four binary current cells corresponding to the four bits of signal d. Each binary current cell 3 is activated or deactivated according to the state or value of one of the bits of signal d. The least significant bit (LSB), i.e. bit no. 0, of signal d, corresponding to the LSB of signal a, activates a binary current cell which is adapted to output a current of a relative magnitude of 1, the bit no. 1 of signal d causes a current of a relative magnitude of 2, bit no. 2 of signal d causes a current of a relative magnitude of 4 and bit no. 3 of signal d finally activates a binary current cell 3 which is adapted to generate a current of a relative magnitude of 8. The currents output by digital-to-analog converter 2 are added to form an output signal e.

The upper bits of the digital input signal a are fed to a thermometer encoder 6 as a signal c. In the example, signal c consists of the eight bits nos. 4–11 of the digital input signal a.

In the thermometer encoder 6, this 8 bit signal c is converted to a thermometer encoded signal 1. Since with eight bits values from 0 to 255 are representable, in this case the thermometer encoded signal consists of 255 bits, the number of bits set to 1 representing the value of the 8 bit signal c. The thermometer encoded signal 1 is then fed to an array 8 of unary digital-to-analog converting elements 9 which are realized as unary current cells, that is, each digital-to-analog converting element 9 outputs the same current if activated. The array 8 comprises at least 255 of these unary digital-to-analog converting elements 9, and each bit of the thermometer encoded signal 1 is applied to exactly one unary digital-to-analog converting element 9. In the example, the output current of an activated digital-to-analog converting element 9 has a relative magnitude of 16. Thus, a number of digital-to-analog converting elements 9 equal to the value of the 8 bit digital signal c is activated, and their output currents are added to form an output signal f. Output signals e and f are added by adding means 10 to form an output signal g, the magnitude of which corresponds to the value of the digital input signal a.

The use of the array 8 has the advantage that the conversion of the digital input signal a is highly linear, while the conversion of the lower bits by the binary weighted current cells 3 serves to reduce the chip area necessary. For converting all 12 bits of the digital input signal a through the array 8, 4095 unary digital-to-analog converting elements would be necessary, in contrast to the 255 elements in the example.

Such a DAC as shown in FIG. 2 is generally used for VDSL with moderate oversampling. Additionally, a low order (e.g. first order) digital noise shaping for reducing the noise may be provided, as described in H. Weinberger et al., "A 1.8V 450 mW VDSL 4-Band Analog Front End IC in 0.18 $\mu$m CMOS", IEEE ISSCC 2002, the content of which is also incorporated by reference.

In contrast, FIG. 3 shows a digital-to-analog converter appropriate for ADSL. This transmission format generally requires higher linearity and resolution.

In FIG. 3, a digital input signal b is fed to noise reducing means 4, for example a digital noise shaper. As in an ADSL signal much more oversampling compared to a VDSL signal is available, the digital noise shaping can be used to increase the in-band resolution. The thus generated noise-shaped digital input signal k is fed to a thermometer encoder 6, as in FIG. 2. This thermometer encoder again generates a thermometer encoded signal 1 from the noise-shaped digital input signal k. For example, if the digital input signal b consists of seven bits 0 ... 6, the thermometer encoded signal 1 correspondingly comprises $2^7-1=127$ bits. This thermometer encoded signal may be directly applied to an array 8 of unary digital-to-analog converting elements 9. However, to improve the linearity of the DAC, dynamic element matching means 7 may be additionally provided. Through these dynamic element matching means 7 a dynamic element matching algorithm is applied, so that the digital-to-analog converting elements 9 of the array 8 are not addressed in a fixed order by the individual bits of the thermometer encoded signal 1, but in an arbitrary order. Such an algorithm is described in U.S. Pat. No. 6,462,691 B2, the content of which is again incorporated by reference.

A straightforward approach to implement the DAC in a multi-standard DSL analog front end is to use optimized CACs as shown in FIGS. 2 and 3 for both transmission formats and select the appropriate one by digital control. Although this solution will be optimal with respect to power consumption, it will suffer from a significant silicon area overhead, since two separate arrays 8 of digital-to-analog converting elements are required. Furthermore, also analog multiplexers are needed for multiplexing the output of the two implemented DACs, which easily degrade the quality of the output signal.

SUMMARY OF THE INVENTION

It is thus an object of the present invention to provide a digital-to-analog converter arrangement capable of processing data formats with different requirements which minimizes the needed chip area while keeping the power consumption low.

To achieve this object, according to the invention a digital-to-analog converter arrangement is provided, comprising a first input terminal for receiving a first digital input signal, a second input terminal for receiving a second digital input signal, switching means being coupled to the first and second input terminals and being adapted to select between the first and second digital input signals so as to output an intermediate digital signal corresponding to the selected one of the first and second digital input signals, and an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output.

In such a digital-to-analog converter arrangement, a single array of unary digital-to-analog converting elements may be used for the conversion of both the first digital input signal and the second digital input signal, thus saving chip area.

In a preferred embodiment, thermometer encoding means are coupled to the switching means and to the array of unary digital-to-analog converting elements, said thermometer encoding means being adapted to convert the intermediate digital signal to a thermometer encoded intermediate signal, whereby each bit of the thermometer encoded intermediate signal is applied to a different unary digital-to-analog converting element. The unary digital-to-analog converting elements may be current sources activated according to the state or value of the respective bit of the thermometer encoded intermediate signal applied to them.

To improve the linearity of the digital-to-analog converter arrangement, dynamic element matching means may be provided.

Advantageously, the array of unary digital-to-analog converting elements comprises at least $2^n-1$ unary digital-to-analog converting elements, n being the larger one of the bitwidths of the first and second digital input signals.

Quantization noise reducing means may be used especially in cases where at least one of the digital input signals has a high oversampling.

To process, for example, VDSL signals, the digital-to-analog converter arrangement may further comprise segmenting means having a third input terminal for receiving a third digital input signal, the segmenting means being adapted such that a predetermined number of upper bits of the third digital input signal is output to one of the first or second input terminals, thus forming the first or second digital input signal, while the remaining lower bits of the third digital input signal are output to further digital-to-analog converting means for converting these lower bits of the third digital input signal into a further analog output signal. These further digital-to-analog converting means may comprise binary current cells. The further analog output signal and the analog output signal of the array of unary digital-to-analog converting elements may then be added to form an added output signal.

The digital-to-analog converter arrangement may be realized as an unipolar current steering digital-to-analog converter arrangement or as a fully differential current steering digital-to-analog converter arrangement, e.g. for use in a multi-standard DSL modem.

Preferably, the first digital input signal is a VDSL signal, while the second digital input signal is an ADSL signal. As a matter of course, however, the present invention is not limited to these particular data formats, but may be applied in general to any possible digital data formats.

BRIEF DESCRIPTION OF THE DRAWINGS

A preferred embodiment of the invention will now be described, by way of example only, with reference to the accompanying drawings, in which:

FIG. 2 is an example for a prior art digital-to-analog converter suitable for VDSL signals; and FIG. 3 is an example for a prior art digital-to-analog converter suitable for ADSL signals.

In FIG. 1, a preferred embodiment of a digital-to-analog converter arrangement according to the present invention is shown. This digital-to-analog converter arrangement exhibits features of both prior art digital-to-analog converters of FIG. 2 and FIG. 3, both of which having been described above in detail. Elements common to the digital-to-analog converter arrangements of FIGS. 1 to 3 are denoted with the same reference numerals, and as to these elements reference can also be made to the above description with respect to FIG. 2 and FIG. 3.

Referring now to FIG. 1, a third digital input signal a, for example a VDSL signal with 12 bits 0 to 11, is fed to segmenting means 1 of the digital-to-analog converter arrangement. A certain number of the lower bits of the digital input signal a, for example the four lowest bits nos. 0 to 3, are fed as a signal d to a digital-to-analog converting element 2 comprising binary current cells 3. For each of the bits of signal d, one binary current cell 3 is provided. The least significant bit (LSB), i.e. bit no. 0, of signal d controls a binary current cell with a current output with a relative magnitude of 1, the next significant bit, bit 1, controls a binary current cell with a current output of relative magnitude of 2, bit no. 2 of signal d controls a binary current cell, the current of which has a relative magnitude of 4, and bit no. 3 of signal 6 controls a binary current cell 3, the output current of which has a relative magnitude of 8. The output currents of the binary current cells are added to form an output signal e, the magnitude of which corresponds to the analog value of the 4 bit digital signal d.

Figure 1:
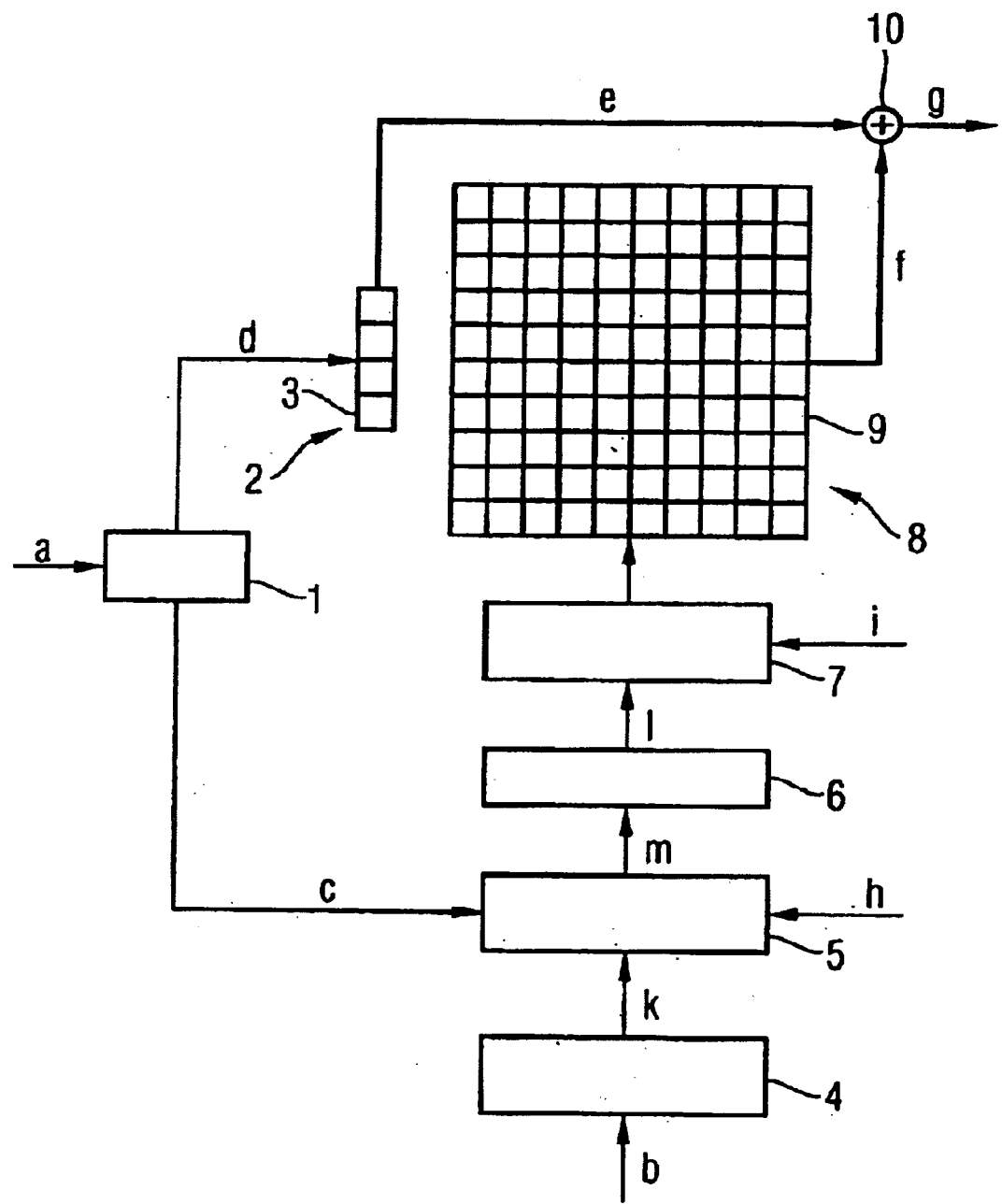
FIG. 1 is a preferred embodiment of a digital-to-analog converter arrangement according to the present invention.

The remaining bits of the digital input signal a, in this case bits nos. 4 to 11, form a first digital input signal c. This first digital input signal c is fed to a multiplexer 5.

Furthermore, a second digital input signal b, for example a 6 bit ADSL input signal with bits nos. 0 to 5, is applied to a second input terminal of the digital-to-analog converter arrangement. Noise reducing means 4 are provided to apply a noise-shaping algorithm to the second digital input signal b to reduce e.g. quantization noise. The digital signal k obtained in this way is also fed to the multiplexer 5. Multiplexer 5 serves as switching means to select either the first digital input signal c or the digital signal k and output it as an intermediate digital signal m. This selection is effected dependent on selection control signal h. This selection control signal may be for example generated by a switch (not shown) operable by a user depending on whether the digital-to-analog converter arrangement is used for VDSL or for ADSL signal, or signal detection means (not shown) may be provided to automatically detect whether digital input signal a or digital input signal b is applied and to operate the multiplexer 5 accordingly.

The digital signal m is then fed to a thermometer encoder 6. This thermometer encoder 6 converts the digital signal m to a thermometer encoded signal 1. The thermometer encoded signal 1 has at least $2^n-1$ bits, n being the maximum bitwidth of signal m. In the present example, signal m has the bitwidth 8 or 6, depending on whether signal c or signal k is selected. Thus, the thermometer encoded signal 1 has at least 255 bits. The number of bits set in the thermometer encoded signal 1 corresponds to the value of digital signal m. The thermometer encoded signal 1 is fed to dynamic element matching means 7.

The dynamic element matching means 7 are connected to an array 8 of unary digital-to-analog converting elements 9, i.e. 1 bit digital-to-analog converters which all output nominally the same current when the bit applied to them is set, while they all do not output a current if the bit applied to them is not set. The dynamic element matching means 7 apply each bit of the thermometer encoded signal 1 to exactly one of the arbitrary unary digital-to-analog converting elements 9. The dynamic element matching means 7 may be switched off so that the bits of the thermometer encoded signal 1 are applied to the unary digital-to-analog converting elements 9 in a fixed order. For example, the dynamic element matching means 7 may be switched off if the multiplexer has selected the first digital input signal c which is a part of the VDSL digital input signal a, since due to the reduced oversampling of VDSL compared to ADSL the dynamic element matching ("scrambling") is not as useful as in the case of an ADSL signal.

In the present case, the output current of a single unary digital-to-analog converting element 9 has a relative magnitude of 16 to match with the digital-to-analog converting element 2. The output currents of all the unary digital-to-analog converting elements 9 in the array 8 are added to form an analog output signal f. Adding means 10 are provided to add the analog output signals e and f to form an analog output signal g of the digital-to-analog converter arrangement, the magnitude of which corresponds to the value of either the digital input signal a or the second digital input signal b, depending on the selection of the multiplexer 5.

It should be noted that in the embodiment described the current corresponding to the value of the least significant bit of the digital input signal a has a relative magnitude of 1, while the output current of the output signal g corresponding to the least significant bit of the second digital input signal b has a relative magnitude of 16. However, this is only a particular embodiment, while of course other bit width combinations are possible.

The number of binary weighted current cells 3 as well as the number of unary digital-to-analog converting elements 9 may vary according to the specific application.

The main advantage of such a digital-to-analog converter arrangement is the optimum die area, since only one array of unary digital-to-analog converting elements is needed. Also the power consumption overhead can be kept at a minimum. No analog multiplexers are required.

The digital-to-analog converter arrangement may be realized as a unipolar current steering digital-to-analog converter arrangement with passive resistive termination, or it may be realized as a fully differential current steering digital-to-analog converter arrangement with an onchip transimpedance output buffer as described in M. Clara, A. Wiesbauer, B. Seger, "A 12-Bit Fully Differential Current-Steering DAC with Regulated Segmented Architecture", Telematik 4/2000, the content of which is incorporated by reference.

Various variations of the above-described embodiments are possible. For example, a noise-shaping algorithm, especially a low-order noise-shaping, may be also applied to the digital input signal a. Furthermore, the digital-to-analog converter arrangement is not necessarily limited to select between ADSL and VDSL inputs, but a multi-standard digital-to-analog converter arrangement for various types of digital signals or other xDSL standards may be realized as well. In principle, the arrangement can especially be used for any DAC solution where different signal bandwidths are to be processed. Also, the multiplexer 5 may be adapted to select between more than two signals, so that more different signal types can be processed.

What is claimed is:

1. A digital-to-analog converter arrangement, comprising
   a first input terminal for receiving a first digital input signal;
   a second input terminal for receiving a second digital input signal;
   switching means being coupled to the first and second input terminals and being adapted to select between the first and second digital input signals so as to output an intermediate digital signal corresponding to the selected one of the first and second digital input signals; and
   an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output,
   wherein the converter is designed for converting at least a part of a first type DSL signal as the first digital input signal and at least a part of a second type DSL signal as the second digital input signal.

2. The digital-to-analog converter arrangement according to claim 1,
   further comprising thermometer encoding means are coupled to the switching means and to the array of unary digital-to-analog converting elements, said thermometer encoding means being adapted to convert the intermediate digital signal to a thermometer encoded intermediate signal,
   wherein each bit of the thermometer encoded intermediate signal is applied to a respective one of the unary digital-to-analog converting elements.

3. The digital-to-analog converter arrangement according to claim 2, wherein the unary digital-to-analog converting elements are current sources activated according to a value of the respective bit of the thermometer encoded intermediate signal applied to them.

4. The digital-to-analog converter arrangement according to claim 2, further comprising dynamic element matching means for applying arbitrary bits of the thermometer encoded intermediate signal to respective unary digital-to-analog converting elements.

5. The digital-to-analog converter arrangement to claim 4, wherein the dynamic element matching means are activated and deactivated depending on which one of the first and second digital input signals is selected by the switching means.

6. The digital-to-analog converter arrangement according to claim 1, wherein the array of unary digital-to-analog converting elements comprises at least $2^n-1$ unary digital-to-analog converting elements, n being the larger one of bitwidths of the first and second digital input signals.

7. The digital-to-analog converter arrangement according to claim 1, further comprising noise reducing means are coupled between at least one of said input terminals and said switching means.

8. The digital-to-analog converter arrangement according to claim 1, further comprising segmenting means having a third input terminal for receiving a third digital input signal, the segmenting means being adapted such that a predetermined number of upper bits of the third digital input signal is output to one of the first or second input terminals, thereby forming the first or second digital input signal, while the remaining lower bits of the third digital input signal are output to digital-to-analog converting means for converting the remaining lower bits of the third digital input signal into a further analog output signal.

9. The digital-to-analog converter arrangement according to claim 8, wherein the digital-to-analog converting means comprise binary current cells.

10. The digital-to-analog converter arrangement according to claim 8, further comprising adding means coupled to the digital-to-analog converting means and to the array of unary digital-to-analog converting elements for adding the respective analog output signals to form an added analog output signal.

11. The digital-to-analog converter arrangement according to claim 1, wherein the digital-to-analog converter arrangement is designed as an unipolar current steering digital-to-analog converter arrangement.

12. The digital-to-analog converter arrangement according to claim 1, wherein the digital-to-analog converter arrangement is designed as a fully differential current steering digital-to-analog converter arrangement.

13. The digital-to-analog converter arrangement according to claim 1, the first type DSL signal being a VDSL signal and the second type DSL signal being an ADSL signal.

14. Communication apparatus, having a digital-to-analog converter arrangement, said digital-to-analog converter arrangement comprising
a first input terminal for receiving a first digital input signal;
a second input terminal for receiving a second digital input signal;
switching means being coupled to the first and second input terminals and being adapted to select between the first and second digital input signals so as to output an intermediate digital signal corresponding to the selected one of the first and second digital input signals; and
an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output,
wherein the converter is designed for converting at least a part of a first type DSL signal as the first digital input signal and at least a part of a second type DSL signal as the second digital input signal.

15. A digital-to-analog converter arrangement, comprising:
a first input terminal for receiving a first digital input signal;
a second input terminal for receiving a second digital input signal;
switching means being coupled to the first and second input terminals and being adapted to select between the first and second digital input signals so as to output an intermediate digital signal corresponding to the selected one of the first and second digital input signals; and an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output,
wherein the unary digital-to-analog converting elements are current sources activated according to a value of the respective bit of the thermometer encoded intermediate signal applied to them.

16. A digital-to-analog converter arrangement, comprising:
a first input terminal for receiving a first digital input signal;
a second input terminal for receiving a second digital input signal;
switching means being coupled to the first and second input terminals and being adapted to select between the first and second digital input signals so as to output an intermediate digital signal corresponding to the selected one of the first and second digital input signals;
an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output,
thermometer encoding means are coupled to the switching means and to the array of unary digital-to-analog converting elements, said thermometer encoding means being adapted to convert the intermediate digital signal to a thermometer encoded intermediate signal,
wherein each bit of the thermometer encoded intermediate signal is applied to a respective one of the unary digital-to-analog converting elements,
and dynamic element matching means for applying arbitrary bits of the thermometer encoded intermediate signal to respective unary digital-to-analog converting elements, wherein the dynamic element matching means are activated and deactivated depending on which one of the first and second digital input signals is selected by the switching means.

17. A digital-to-analog converter arrangement, comprising:

a first input terminal for receiving a first digital input signal;

a second input terminal for receiving a second digital input signal;

switching means being coupled to the first and second input terminals and being adapted to select between the first and second digital input signals so as to output an intermediate digital signal corresponding to the selected one of the first and second digital input signals; and an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output, wherein the array of unary digital-to-analog converting elements comprises at least $2^n-1$ unary digital-to-analog converting elements, n being the larger one of bitwidths of the first and second digital input signals.

18. A digital-to-analog converter arrangement, comprising:

a first input terminal for receiving a first digital input signal;

a second input terminal for receiving a second digital input signal;

switching means being coupled to the first and second input terminals and being adapted to select between the first and second digital input signals so as to output an intermediate digital signal corresponding to the selected one of the first and second digital input signals;

an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output, and segmenting means having a third input terminal for receiving a third digital input signal, the segmenting means being adapted such that a predetermined number of upper bits of the third digital input signal is output to one of the first or second input terminals, thereby forming the first or second digital input signal, while the remaining lower bits of the third digital input signal are output to digital-to-analog converting means for converting the remaining lower bits of the third digital input signal into a further analog output signal.

19. The digital-to-analog converter arrangement according to claim 18, wherein the digital-to-analog converting means comprise binary current cells.

20. The digital-to-analog converter arrangement according to claim 18, further comprising adding means coupled to the digital-to-analog converting means and to the array of unary digital-to-analog converting elements for adding the respective analog output signals to form an added analog output signal.

21. A digital-to-analog converter arrangement, comprising:

a first input terminal for receiving a first digital input signal;

a second input terminal for receiving a second digital input signal;

switching means being coupled to the first and second input terminals and being adapted to select between the first and second digital input signals so as to output an intermediate digital signal corresponding to the selected one of the first and second digital input signals; and an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output, wherein the digital-to-analog converter arrangement is designed as an unipolar current steering digital-to-analog converter arrangement.

22. A digital-to-analog converter arrangement, comprising:

a first input terminal for receiving a first digital input signal;

a second input terminal for receiving a second digital input signal;

switching means being coupled to the first and second input terminals and being adapted to select between the first and second digital input signals so as to output an intermediate digital signal corresponding to the selected one of the first and second digital input signals; and an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output, wherein the digital-to-analog converter arrangement is designed as a fully differential current steering digital-to-analog converter arrangement.

23. A digital-to-analog converter arrangement, comprising:

a first input terminal for receiving a first digital input signal;

a second input terminal for receiving a second digital input signal;

switching means being coupled to the first and second input terminals and being adapted to select between the first and second digital input signals so as to output an intermediate digital signal corresponding to the selected one of the first and second digital input signals; and an array of unary digital-to-analog converting elements coupled to the switching means for receiving the intermediate digital signal therefrom, each unary digital-to-analog converting element being adapted so that, as an analog output signal, a sum signal of output signals of the unary digital-to-analog converting elements is output, wherein the converter is designed for converting a first-type signal having a first bitwidth as the first digital input signal and a second-type signal having a second bitwidth different from the first bitwidth as the second digital input signal.

* * * * *